United States Patent
Koo et al.

(10) Patent No.: US 7,170,088 B2
(45) Date of Patent: Jan. 30, 2007

(54) ORGANIC THIN FILM TRANSISTOR AND FLAT PANEL DISPLAY COMPRISING THE SAME

(75) Inventors: Jae-Bon Koo, Suwon-si (KR); Min-Chul Suh, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 11/145,933

(22) Filed: Jun. 7, 2005

(65) Prior Publication Data
US 2005/0269568 A1 Dec. 8, 2005

(30) Foreign Application Priority Data
Jun. 8, 2004 (KR) ............... 10-2004-0041861

(51) Int. Cl.
H01L 29/08 (2006.01)
H01L 29/76 (2006.01)
(52) U.S. Cl. ............... 257/40; 257/66; 257/401
(58) Field of Classification Search .......... 257/66, 257/347, 352, 368, 40, 401
See application file for complete search history.

(56) References Cited
U.S. PATENT DOCUMENTS

| | | | |
|---|---|---|---|
| 5,886,757 A * | 3/1999 | Song et al. ............... 349/43 |
| 6,300,988 B1 * | 10/2001 | Ishihara et al. ............ 349/43 |
| 6,344,662 B1 * | 2/2002 | Dimitrakopoulos et al. .. 257/40 |
| 6,617,182 B2 * | 9/2003 | Ishida et al. ............... 438/22 |
| 6,897,482 B2 * | 5/2005 | Morita et al. .............. 257/72 |
| 6,924,854 B2 * | 8/2005 | Chung ...................... 349/43 |
| 2001/0015438 A1 * | 8/2001 | Callegari et al. .......... 257/40 |
| 2004/0012018 A1 * | 1/2004 | Tanabe ..................... 257/40 |
| 2005/0247928 A1 * | 11/2005 | Unno ....................... 257/40 |

FOREIGN PATENT DOCUMENTS

| JP | 2002-190605 | 7/2002 |
|---|---|---|
| JP | 2003-084686 | 3/2003 |

* cited by examiner

*Primary Examiner*—T. N. Quach
(74) *Attorney, Agent, or Firm*—H.C. Park & Associates, PLC

(57) ABSTRACT

An organic TFT including a gate electrode, a source electrode and a drain electrode insulated from the gate electrode, and an organic semiconductor layer that is insulated from the gate electrode and contacts the source electrode and the drain electrode. The length of portions of edges of the source electrode, which contact the organic semiconductor layer and face the drain electrode, is greater than the length of portions of edges of the drain electrode, which contact the organic semiconductor layer and face the source electrode to reduce the contact resistance between the source electrode and the organic semiconductor layer.

17 Claims, 11 Drawing Sheets

ORGANIC THIN FILM TRANSISTOR AND FLAT PANEL DISPLAY COMPRISING THE SAME

CROSS REFERENCE TO RELATED APPLICATION

This application claims priority to and the benefit of Korean Patent Application No. 10-2004-0041861, filed on Jun. 8, 2004, which is hereby incorporated by reference for all purposes as if fully set forth herein.

BACKGROUND OF THE INVENTION

1. Field of the Invention

The present invention relates to an organic thin film transistor (TFT) and a flat panel display having the same, and more particularly, to an organic TFT with reduced contact resistance between an electrode and an organic semiconductor layer.

2. Discussion of the Background

After poly-acetylene was developed, organic material-based transistors have been actively researched for use in functional electronic devices and optical devices. Generally, poly-acetylene is a conjugated organic polymer with semiconductor characteristics. It may be synthesized cheaply and in various ways, it may be easily molded in a fabric or film shape, and it is flexible and conductive.

A conventional silicon TFT has a silicon semiconductor layer with source and drain regions, which are doped with a high concentration of dopant, and a channel region between the source and drain region. A gate electrode is disposed in a region corresponding to the channel region, and it is insulated from the semiconductor layer. A source electrode and a drain electrode are coupled with the source region and the drain region, respectively.

However, conventional silicon TFTs are costly to manufacture, and they may break easily due to an external impact. Additionally, they can not be formed on a plastic substrate since the silicon is produced at a temperature above 300° C., which would damage the plastic substrate.

TFTs are typically used as switching devices that control each pixel's operation and driving devices for each pixel in flat panel display devices, such as liquid crystal displays (LCD) or electroluminescence displays (ELD). Plastic materials, instead of a conventional glass material, have been used to form a substrate in order to provide large, thin, and flexible display devices. However, since the plastic materials must be processed at a low temperature, conventional silicon TFTs can not be used.

On the other hand, this problem can be solved by using an organic film as a TFT's semiconductor layer. Therefore, research into such organic TFTs has been actively performed.

However, with the TFT having the organic semiconductor layer, high contact resistance may exist between source and drain electrodes and the organic film. The source and drain electrodes are conventionally formed of a metal having a low work function for the smooth flow of charges, but the metal can reduce the device's characteristics due to the generation of a contact resistance when it contacts the organic semiconductor layer, which can also increase power consumption.

SUMMARY OF THE INVENTION

The present invention provides an organic TFT that has reduced contact resistance between an electrode and an organic semiconductor layer.

The present invention also provides a flat panel display having the organic TFT.

Additional features of the invention will be set forth in the description which follows, and in part will be apparent from the description, or may be learned by practice of the invention.

The present invention discloses an organic TFT including a substrate; a gate electrode disposed on the substrate, a source electrode and a drain electrode insulated from the gate electrode and disposed on the substrate, and an organic semiconductor layer that contacts each of the source electrode and the drain electrode, is insulated from the gate electrode, and is disposed on the substrate. The sum of lengths of portions of edges of the source electrode, which are parallel to the substrate, contact the organic semiconductor layer, and face the drain electrode, is greater than the sum of lengths of portions of edges of the drain electrode, which are parallel to the substrate, contact the organic semiconductor layer, and face the source electrode.

The present invention also discloses a flat panel display that includes an organic TFT.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

The present invention will now be described more fully with reference to the accompanying drawings showing exemplary embodiments of the invention.

Figure 1:
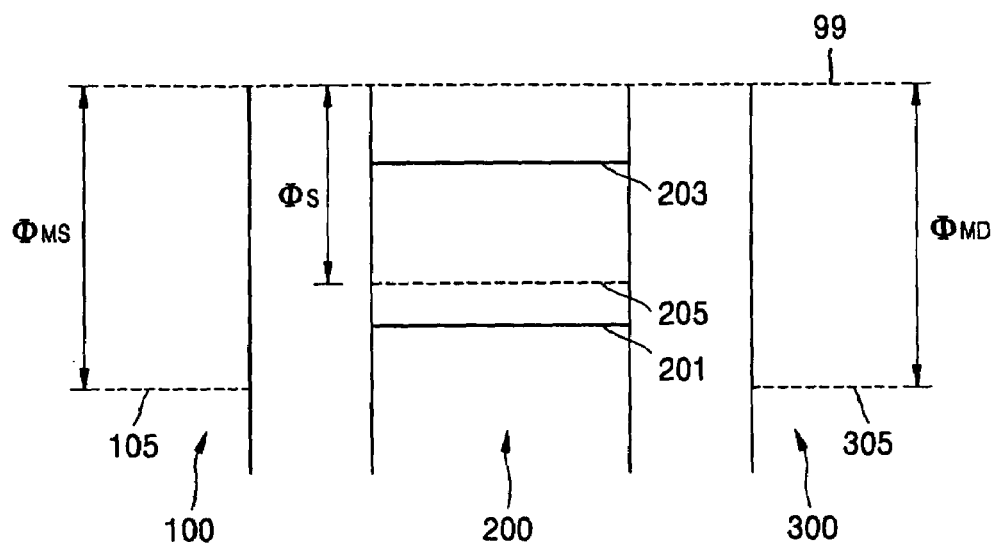
FIG. 1 is a conceptual drawing showing energy band diagrams of a source electrode, a P-type organic semiconductor layer, and a drain electrode before contacting each other.

FIG. 1 is a conceptual drawing showing energy band diagrams of a source electrode 100, a P-type organic semiconductor layer 200, and a drain electrode 300 before contacting each other. Hereinafter, an organic TFT having the P-type organic semiconductor layer 200 will be described, but the present invention is not limited thereto. Rather, it may also be applied to an organic TFT having different types of organic semiconductor layers.

Referring to FIG. 1, the energy differences between a vacuum energy level 99 and the Fermi energy levels 105 and 305 of the source electrode 100 and the drain electrode 300 are the source and drain electrodes' work functions $\phi_{MS}$ and $\phi_{MD}$, respectively. The energy difference between the vacuum energy level 99 and the Fermi energy level 205 of the P-type organic semiconductor layer 200 is the semiconductor layer's work function $\phi_S$ FIG. 2 is a conceptual drawing showing energy band diagrams of a source electrode 100, a P-type organic semiconductor layer 200, and a drain electrode 300 after ohmic contacting each other.

Figure 2:
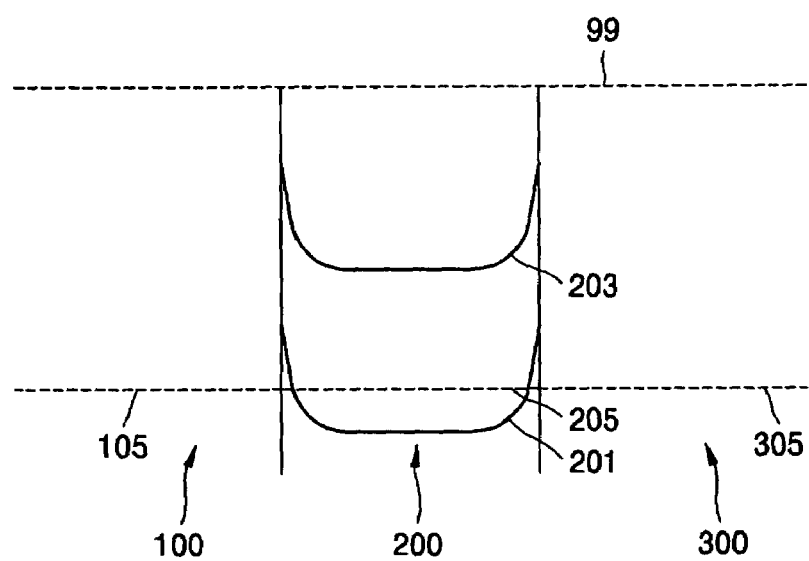
FIG. 2 is a conceptual drawing showing energy band diagrams of a source electrode, a P-type organic semiconductor layer, and a drain electrode after ohmic contacting each other.

Referring to FIG. 2, when the source electrode 100, the P-type organic semiconductor layer 200, and the drain electrode 300 come into contact, the Fermi energy level 205 of the P-type organic semiconductor layer 200 decreases since the Fermi energy levels 105, 205, and 305 become the same level. At this time, as FIG. 2 shows, the energy band of the P-type organic semiconductor layer 200 bends due to a gap between its Fermi energy level 205 and its highest occupied molecular orbit level (HOMO level) 201 and a gap between its Fermi energy level 205 and its lowest unoccupied molecular orbit level (LUMO level) 203, which are maintained identical to the levels before the source electrode 100, the P-type organic semiconductor layer 200, and the drain electrode 300 come into contact.

Figure 3:
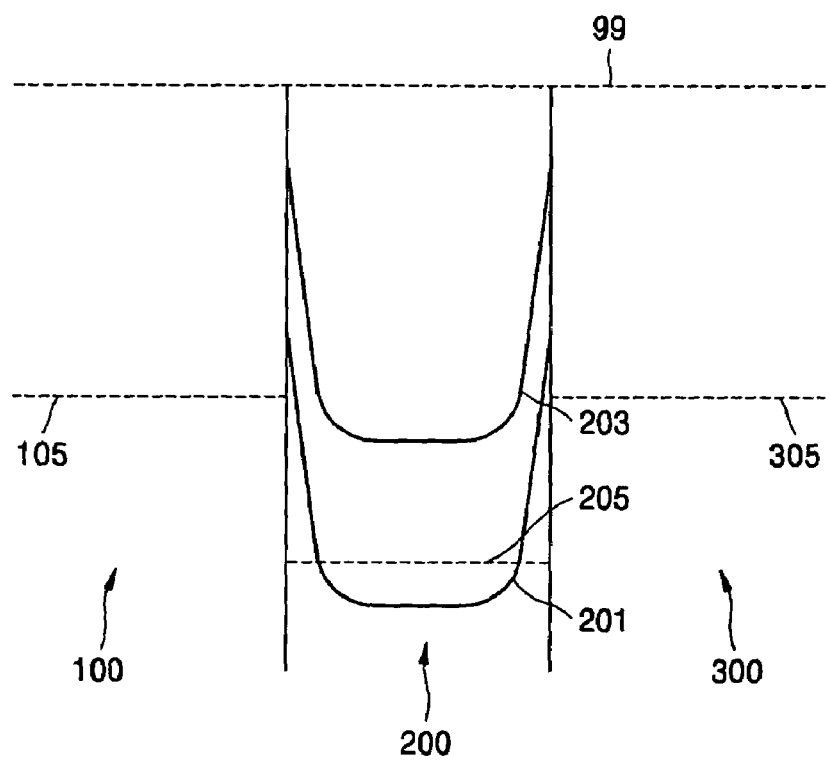
FIG. 3 is a conceptual drawing showing energy band diagrams of a source electrode, a P-type organic semiconductor layer, and a drain electrode when applying a positive bias voltage to an organic TFT's gate electrode.
Figure 4:
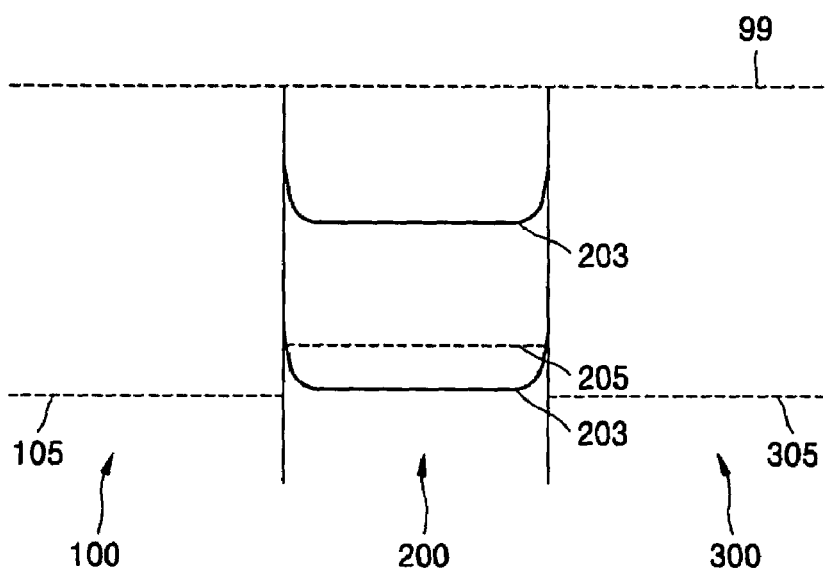
FIG. 4 is a conceptual drawing showing energy band diagrams of a source electrode, a P-type organic semiconductor layer, and a drain electrode when applying a negative bias voltage to an organic TFT's gate electrode.

FIG. 3 is a conceptual drawing showing energy band diagrams of a source electrode 100, a P-type organic semiconductor layer 200, and a drain electrode 300 when applying a positive bias voltage to the organic TFT's gate electrode. FIG. 4 is a conceptual drawing showing energy band diagrams of a source electrode 100, a P-type organic semiconductor layer 200, and a drain electrode 300 when applying a negative bias voltage to the organic TFT's gate electrode.

Referring to FIG. 3 and FIG. 4, applying a positive bias voltage the organic TFT's gate electrode does not form a channel in the P-type organic semiconductor layer 200. Conversely, applying a negative bias voltage the organic TFT's gate electrode forms a channel in the P-type organic semiconductor layer 200. The formation of the channel will be described in detail later.

Figure 5:
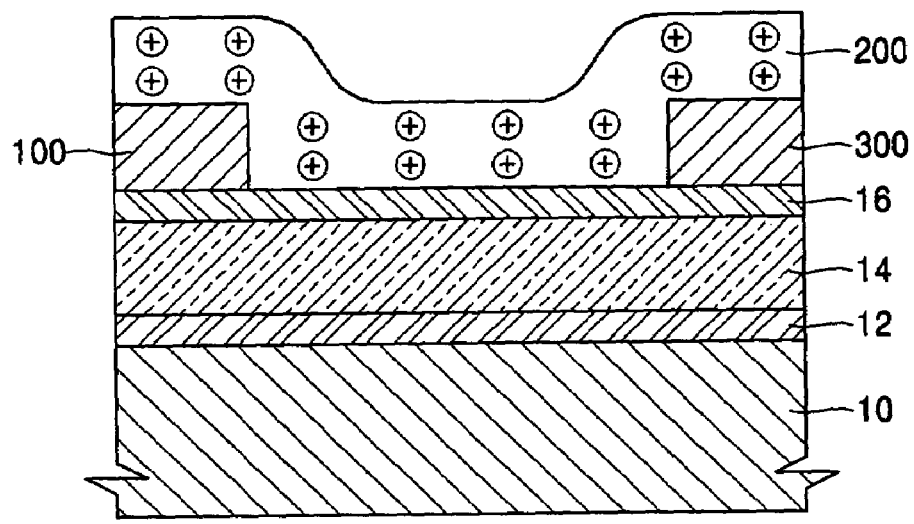
FIG. 5, FIG. 6 and FIG. 7 are cross-sectional views showing an organic TFT for explaining the organic TFT's structure and principle of operation.
Figure 6:
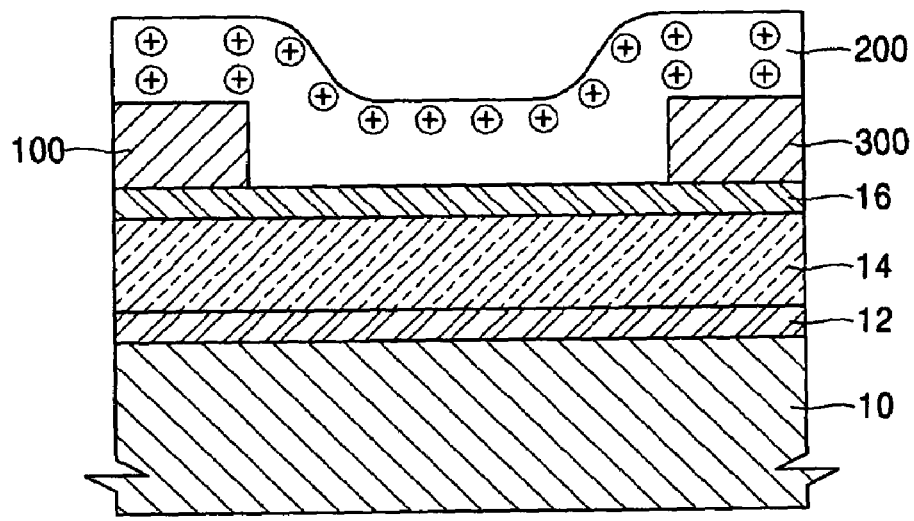
Figure 7:
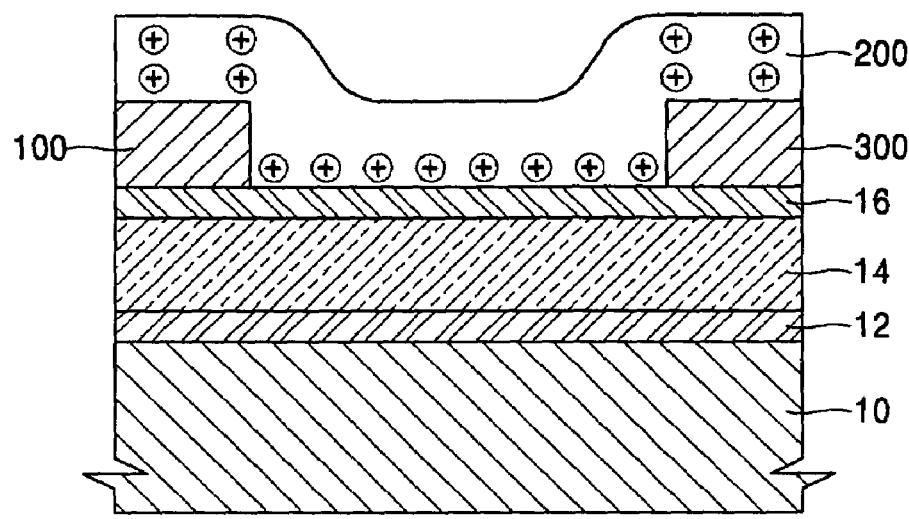

FIG. 5, FIG. 6 and FIG. 7 are cross-sectional views showing a structure of an organic TFT having a P-type organic semiconductor layer 200 and for explaining the principle of operation of the organic TFT's semiconductor layer.

Referring to FIG. 5, FIG. 6 and FIG. 7, a buffer layer 12, a gate electrode 14, and a gate insulating film 16 may be sequentially formed on a substrate 10. A source electrode 100 and a drain electrode 300, which are insulated from the gate electrode 14 by the gate insulating film 16, may be formed on the gate insulating film 16. A P-type organic semiconductor layer 200, which contacts the source electrode 100 and the drain electrode 300, may be formed on the gate insulating film 16, the source electrode 100, and the drain electrode 300.

FIG. 5 is a cross-sectional view illustrating an organic TFT without a bias voltage applied to the gate electrode 14. Charges (i.e. holes) are uniformly distributed in the P-type organic semiconductor layer 200, and FIG. 2 shows the energy band diagram in this state.

In the above structure, a current can be made to flow through a device by generating a potential difference between the source electrode 100 and the drain electrode 300. In this case, the source electrode 100 may act as an electron or hole supplier since it is grounded.

FIG. 6 is a cross-sectional view of an organic TFT when applying a positive bias to the TFT's gate electrode 14, and FIG. 3 shows the energy band diagram in this state.

Referring to FIG. 6, applying the positive bias voltage to the gate electrode 14 generates an electric field, which causes holes in the P-type organic semiconductor layer 200 to accumulate on a face of the layer opposite to the gate insulating film 16. Consequently, a depletion layer in which carriers (i.e. holes, in the P-type case) may not exist is formed in the P-type organic semiconductor layer 200 near the gate insulating film 16. Accordingly, in this case, a minimal current may flow between the source electrode 100 and the drain electrode 300 even though a predetermined bias voltage is applied therebetween.

FIG. 7 is a cross-sectional view showing an organic TFT when applying a negative bias voltage to the TFT's gate electrode 14, and FIG. 4 shows the energy band diagram at this state.

Referring to FIG. 7, applying the negative bias voltage to the gate electrode 14 generates an electric field, which causes holes in the P-type organic semiconductor layer 200 to accumulate on a face of the semiconductor layer facing the gate insulating film 16. As a result, an accumulation layer in which carriers (i.e. holes, in the P-type case) accumulate is formed near the gate insulating film 16 in the P-type organic semiconductor layer 200. Accordingly, a current may flow between the source electrode 100 and the drain electrode 300 due to the accumulated holes when a predetermined bias voltage is applied therebetween.

The amount of current that flows between the source electrode 100 and the drain electrode 300 can be controlled by controlling the polarity of the bias voltage applied to the gate electrode 14 while applying a predetermined bias voltage between the source and drain electrodes based on the same principle as described above. This current ratio is an on/off ratio, and the higher the on/off ratio, the better the organic TFT.

Figure 8:
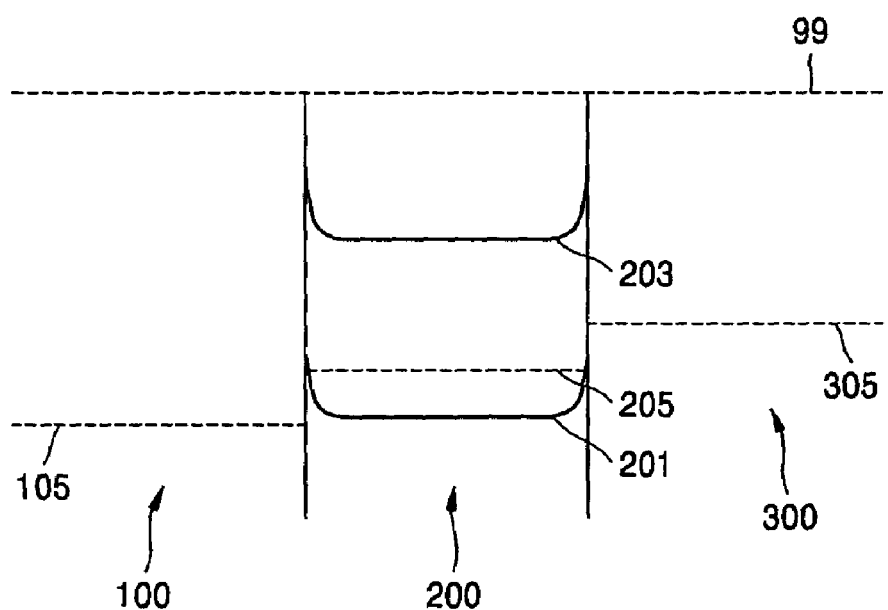
FIG. 8 is a conceptual drawing showing energy band diagrams of a source electrode, an organic semiconductor layer, and a drain electrode when applying negative voltages to a gate electrode and the drain electrode of the organic TFT.

FIG. 8 is a conceptual drawing showing an energy band diagram of an organic TFT when applying a negative bias voltage to the gate electrode 14 and applying a predetermined bias voltage between the source electrode 100 and the drain electrode 300, as depicted in FIG. 7.

Referring to FIG. 8, in the case of the P-type organic TFT as described above, applying a negative bias voltage to the gate electrode 14 forms a channel in the P-type organic semiconductor layer 200. The source electrode 100 acts as a hole supplier since it is grounded, and accordingly, a negative bias voltage is applied to the drain electrode 300. Therefore, a potential barrier, (i.e., a contact resistance between the P-type organic semiconductor layer 200 and the drain electrode 300), can be controlled by controlling the negative bias voltage applied to the drain electrode 300.

However, the contact resistance between the source electrode 100 and the P-type organic semiconductor layer 200 can not be controlled once the organic TFT is manufactured since the source electrode 100 is grounded and the work function of the metal forming the source electrode and the semiconductor layer's HOMO level determine the contact resistance. Therefore, it is important to reduce the contact resistance between the source electrode 100 and the P-type organic semiconductor layer 200 relative to the contact resistance between the drain electrode 300 and the P-type organic semiconductor layer 200.

Figure 9:
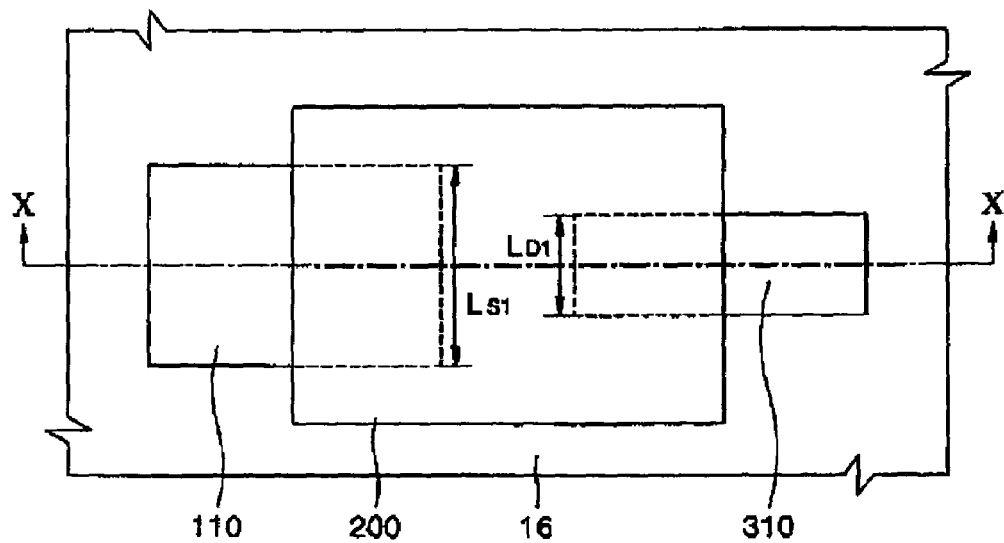
FIG. 9 is a plan view showing an organic TFT according to a first exemplary embodiment of the present invention.
Figure 10:
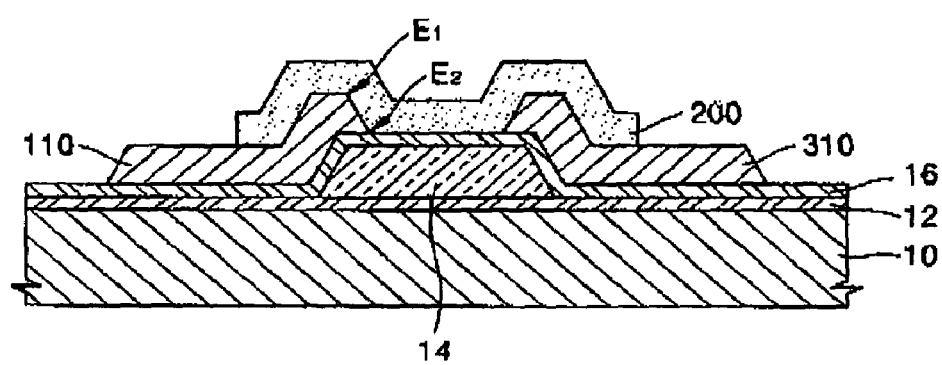
FIG. 10 is a cross-sectional view taken along line X—X of FIG. 9.

FIG. 9 is a plan view showing an organic TFT according to an exemplary embodiment of the present invention, and FIG. 10 is a cross-sectional view taken along line X—X of FIG. 9.

Referring to FIG. 9 and FIG. 10, a gate electrode 14 is formed on a substrate 10, which may formed of glass, plastic, or other like materials. A buffer layer 12, for planarizing the substrate 10, may be interposed between the substrate 10 and the gate electrode 14, and it may be formed by using plasma enhanced chemical vapor deposition (PECVD), atmospheric pressure chemical vapor deposition (APCVD), low pressure chemical vapor deposition (LPCVD), electron cyclotron resonance (ECR), or other like methods. The gate electrode 14 can be formed of a conductive material such as a conductive metal, including MoW, Al, Cr, or Al/Cu, or a conductive polymer, and it can be formed using sputtering and photolithography, inkjet deposition, or other like methods.

A gate insulating film 16, which covers the gate electrode 14, is formed on the gate electrode 14, and a source electrode 110 and a drain electrode 310, which are insulated from the gate electrode 14 by the gate insulating film 16, may be formed on the gate insulating film 16 by sputtering and photolithography, inkjet deposition, or other like methods. As FIG. 10 shows, a predetermined portion of the source electrode 110 and the drain electrode 310 can overlap with the gate electrode 14, but the present invention is not limited thereto. The P-type organic semiconductor layer 200 that contacts the source electrode 110 and the drain electrode 310 can be formed using vacuum evaporation, thermal evaporation, or other like methods.

Since the HOMO level of a conventional P-type organic semiconductor layer 200 is approximately 0.5 eV, the work functions of the source electrode 110 and the drain electrode 310 should be greater than the HOMO level 201 of the P-type organic semiconductor layer 200 so that the organic semiconductor layer and the metallic source and drain electrodes can be in an ohmic contact. Therefore, the source electrode 110 and the drain electrode 310 may be formed of a metal having a high work function, such as Au, Pd, Pt, Ni, Rh, Ir, or Os.

The organic semiconductor materials for forming the P-type organic semiconductor layer 200 can be pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyflorene and its derivatives, polythiophenevinylene and its derivatives, polythiophene-heterocyclic aromatic polymeric and its derivatives, oligoacene of naphthalene and its derivatives, alpha-5-thiophene oligothiophene and its derivatives, phthalocyanine that does not include a metal and its derivatives, pyromelitic dianhydride and its derivatives, phyromelitic diimide and its derivatives, perylenetetracarboxylic acid dianhydride and its derivatives, and perylenetetracarboxylic diimide and its derivatives, and other like substances.

The above structure can be applied to the present embodiment as well as the subsequently described embodiments. In the above structure, the product $2L_{S1}$, which is the length of edges of the source electrode 110 that face the drain electrode 310, are parallel to the substrate 10, and contact the P-type organic semiconductor layer 200, is greater than the product $2L_{D1}$, which is the length of edges of the drain electrode 310 that face the source electrode 110, are parallel to the substrate 10, and contact the P-type organic semiconductor layer 200.

Referring to FIG. 9 and FIG. 10, there are two portions of edges of the source electrode 110 of the organic TFT discussed above. The first is an edge $E_1$ at a location where the source electrode 110 and the P-type organic semiconductor layer 200 contact each other, and the second is an edge $E_2$ at a location where the source electrode 110, the P-type organic semiconductor layer 200, and the gate insulating film 16 contact each other. Therefore, the sum of the lengths of the portions of edges of the source electrode 110, which face the drain electrode 310, are parallel to the substrate 10, and contact the P-type organic semiconductor layer 200, is not $L_{S1}$ but $2L_{S1}$. Similarly, the total length for the drain electrode 310 is $2L_{D1}$.

The contact resistance between the source electrode 110 and the P-type organic semiconductor layer 200 can be reduced relatively to the contact resistance between the drain electrode 310 and the organic semiconductor layer when the length $L_{S1}$, which is the length of the source electrode 110 that contacts the channel region, differs from the length $L_{D1}$, which is the length of the drain electrode 310 that contacts the channel region. More specifically, a portion where the source electrode 110 contacts the channel region of the P-type organic semiconductor layer 200 may be longer than a portion where the drain electrode 310 contacts the organic semiconductor layer's channel region.

In the organic TFT of FIG. 9 and FIG. 10, the portions of edges of the source electrode 110, which face the drain electrode 310, are parallel to the substrate 10, and contact the P-type organic semiconductor layer 200 are formed as straight lines. Similarly, the portions of edges of the drain electrode 310, which face the source electrode 110, are parallel to the substrate 10, and contact the P-type organic semiconductor layer 200 are formed as straight lines.

Figure 11:
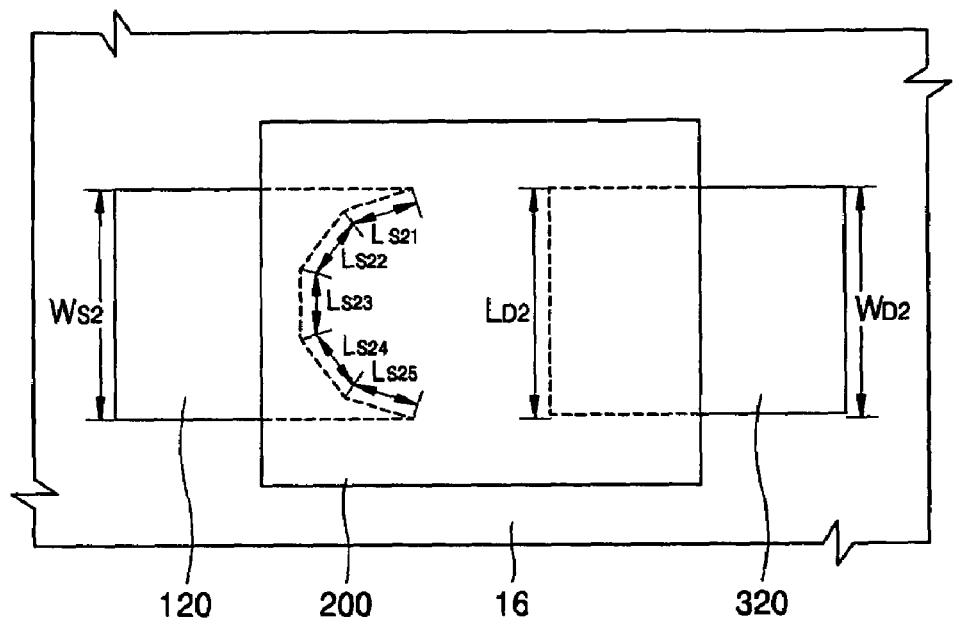
FIG. 11 is a plan view showing an organic TFT according to a second exemplary embodiment of the present invention.

FIG. 11 is a plan view showing an organic TFT according to a second exemplary embodiment of the present invention. A cross-sectional view of FIG. 11 is similar to the cross-sectional view of FIG. 10.

Referring to FIG. 11, portions of edges of the source electrode 120, which face the drain electrode 320, are parallel to the substrate 10, and contact the P-type organic semiconductor layer 200, surround portions of edges of the drain electrode 320, which face the source electrode 120, are parallel to the substrate 10, and contact the P-type organic semiconductor layer 200.

In the organic TFT of FIG. 11, the contact resistance between the source electrode 120 and the P-type organic semiconductor layer 200 can be reduced relatively to the contact resistance between the drain electrode 320 and the P-type organic semiconductor layer 200 by forming a portion where the source electrode 120 contacts the organic semiconductor layer's channel region in a curved shape so that the length $L_{S21}+L_{S22}+L_{S23}+L_{S24}+L_{S25}$ is greater than the length $L_{D2}$ of a portion where the drain electrode 320 contacts the organic semiconductor layer's channel region. As FIG. 11 shows, in this case, the width $W_{S2}$ of an end portion of the source electrode 120 that faces the drain electrode 320 and contacts with the P-type organic semiconductor layer 200 may be equal to the width $W_{D2}$ of an end portion of the drain electrode 320 that faces the source electrode 120 and contacts with the P-type organic semiconductor layer 200.

Figure 12:
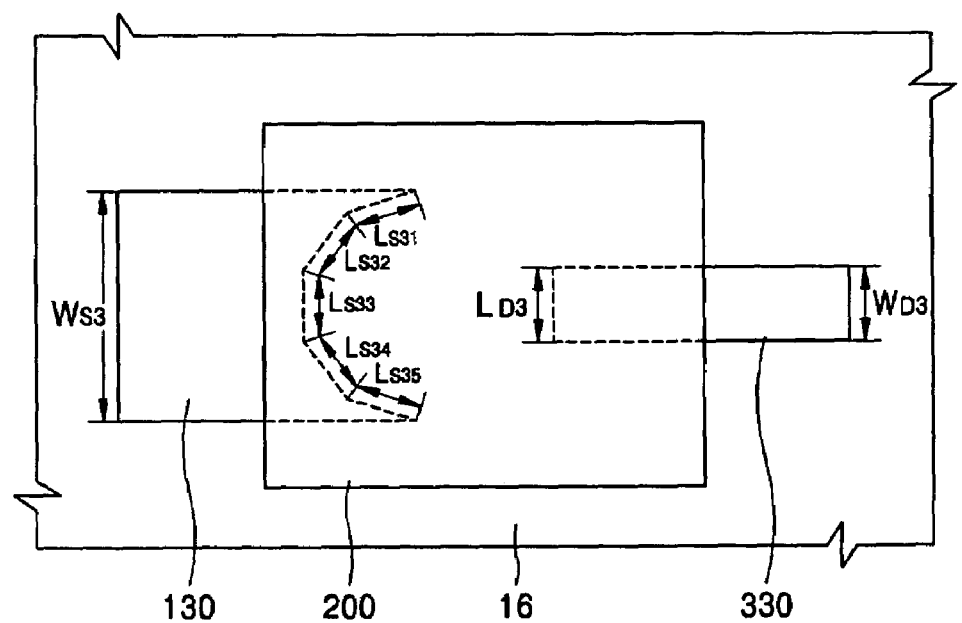
FIG. 12 is a plan view showing an organic TFT according to a third exemplary embodiment of the present invention.

FIG. 12 is a plan view showing an organic TFT according to a third exemplary embodiment of the present invention.

Referring to FIG. 12, the contact resistance between the source electrode 130 and the P-type organic semiconductor layer 200 can be reduced relatively to the contact resistance between the drain electrode 330 and the P-type organic semiconductor layer 200 by forming a portion where the source electrode 130 contacts the organic semiconductor layer's channel region in a curved shape to surround an end portion of the drain electrode 330 so that the length $L_{S31}+L_{S32}+L_{S33}+L_{S34}+L_{S35}$ is greater than the length $L_{D3}$ of a portion where the drain electrode 330 contacts the organic semiconductor layer's channel region. Here, the width $W_{S3}$ of an end portion of the source electrode 130, which faces the drain electrode 330 and contacts the P-type organic semiconductor layer 200, may be greater than the width $W_{D3}$ of an end portion of the drain electrode 330, which faces the source electrode 130 and contacts the P-type organic semiconductor layer 200.

Figure 13:
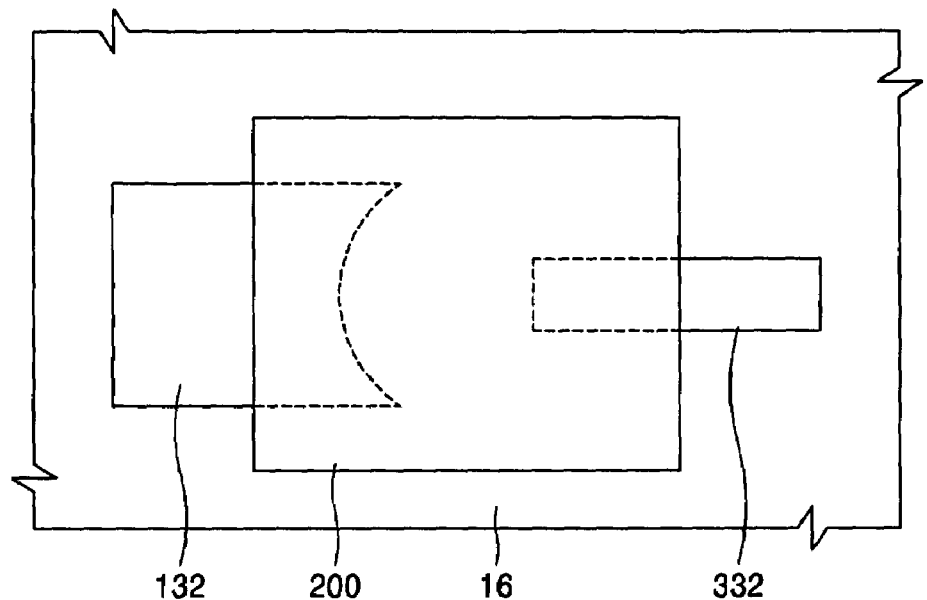
FIG. 13 is a plan view showing a modified version of the TFT of FIG. 12.

The portion where the source electrode 130 contacts the P-type organic semiconductor layer 200 in a curved shape to surround the end portion of the drain electrode 330, as depicted in FIG. 12, may be formed by connecting a plurality of straight line segments with a certain angle to each other. Alternatively, as the source and drain electrodes 132 and 332 of FIG. 13 show, the bent shape portion can also be formed in a smooth, curved shape.

Figure 14:
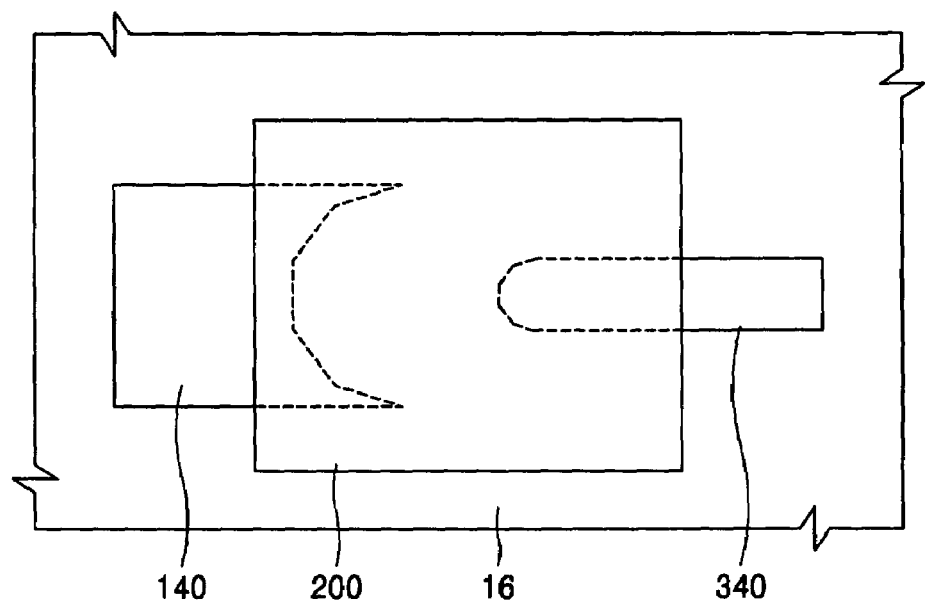
FIG. 14 is a plan view showing an organic TFT according a fourth exemplary embodiment of the present invention.

FIG. 14 is a plan view showing an organic TFT according to a fourth exemplary embodiment of the present invention.

Referring to FIG. 14, a portion of the source electrode 140, which faces the drain electrode 340 and contacts the P-type organic semiconductor layer 200, is wider than a width of a portion of the drain electrode 340, which faces the source electrode 140 and contacts the P-type organic semiconductor layer 200. Simultaneously, the portion where the source electrode 140 contacts the P-type organic semiconductor layer 200 is formed in a curved shape to surround an end portion of the drain electrode 340. Additionally, edges of the source electrode 140, which face the drain electrode 340 and contact the P-type organic semiconductor layer 200, and edges of the drain electrode 340, which faces the source electrode 140 and contacts the P-type organic semiconductor layer 200, may be formed parallel to each other.

A current flow between the source electrode 140 and the drain electrode 340 can be smooth when the contact resistance between the source electrode 140 and the P-type organic semiconductor layer 200 is reduced relatively to the contact resistance between the drain electrode 340 and the P-type organic semiconductor layer 200. This reduced contact resistance may be obtained by forming a portion where the source electrode 140 contacts a channel of the P-type organic semiconductor layer 200 longer than the portion where the drain electrode 340 contacts the organic semiconductor layer's channel.

Figure 15:
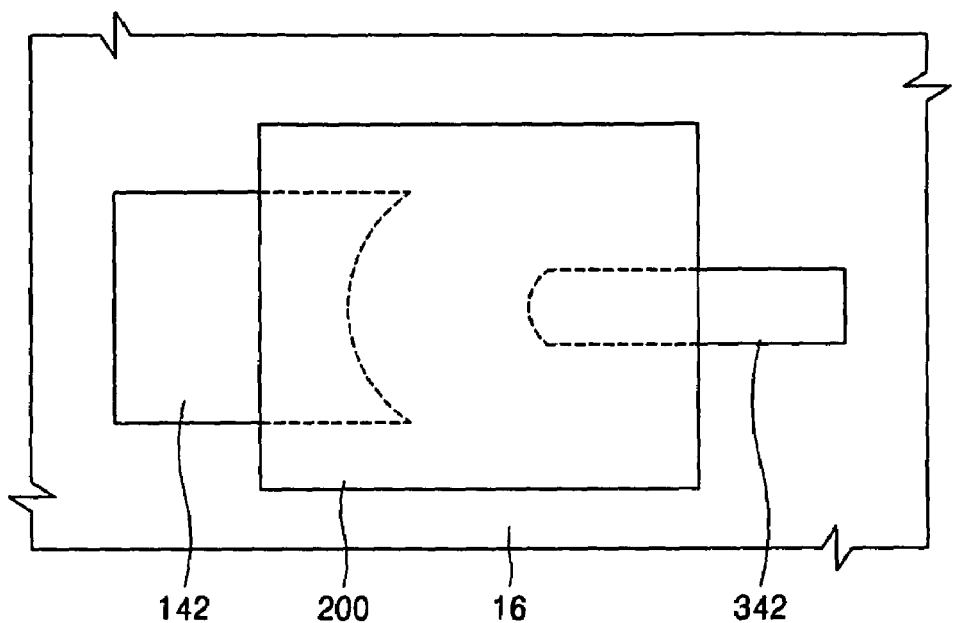
FIG. 15 is a plan view showing a modified version of the TFT of FIG. 14.

Also, in the above embodiment, the portions where the source electrode 140 and the drain electrode 340 contact the P-type organic semiconductor layer 200 in a curved shape may be formed by connecting a plurality of straight line segments with a certain angle to each other, as depicted in FIG. 14. But, as FIG. 15 shows, the bent shape portions of the source and drain electrodes 142 and 342 can also be formed in a smooth, curved line.

In the fourth exemplary embodiment, the portions where the drain electrodes 340 and 342 contact a channel of the P-type organic semiconductor layer 200 are formed in a curved shape. However, as FIG. 12 and FIG. 13 show, portions of edges of the drain electrode, which are parallel to the substrate, contact the P-type organic semiconductor layer, and face the source electrode, can be straight lines.

Figure 16:
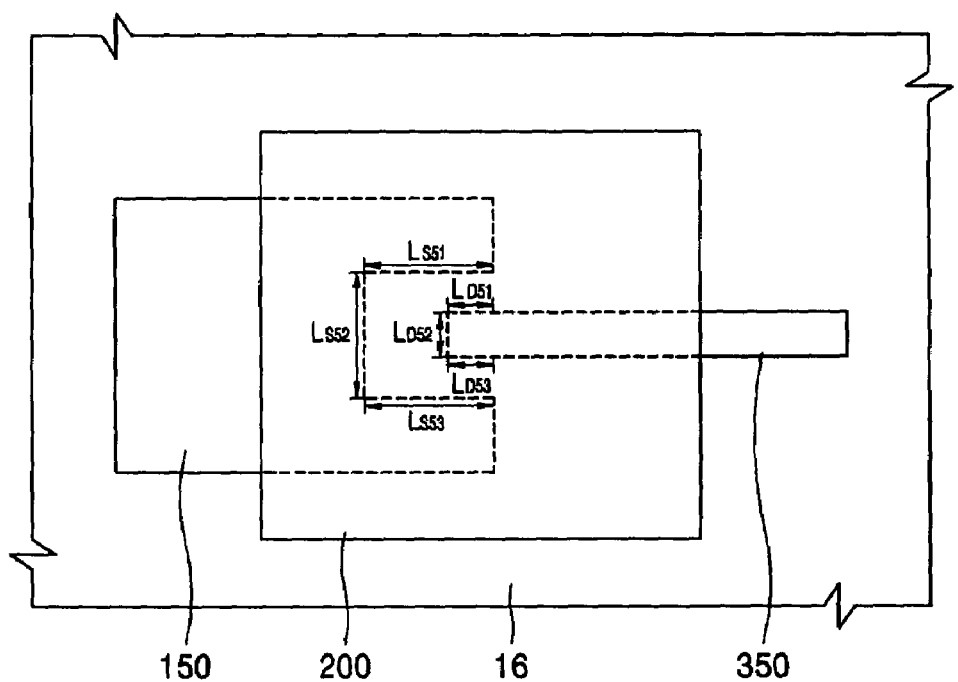
FIG. 16 is a plan view showing an organic TFT according to a fifth exemplary embodiment of the present invention.

FIG. 16 is a plan view showing an organic TFT according to a fifth exemplary embodiment of the present invention.

Referring to FIG. 16, the contact resistance between the source electrode 150 and the P-type organic semiconductor layer 200 can be reduced relatively to the contact resistance between the drain electrode 350 and the P-type organic semiconductor layer 200 by forming the length $L_{S51}+L_{S52}+L_{S53}$ of the portion where the source electrode contacts the organic semiconductor layer's channel greater than the length $L_{D51}+L_{D52}+L_{D53}$ of the portion where the drain electrode contacts the organic semiconductor layer's channel. As FIG. 16 shows, portions of edges of the source electrode 150, which face the drain electrode 350, are parallel to the substrate 10, and contact the P-type organic semiconductor layer 200, may form two first protrusion parts, and portions of edges of the drain electrode 350, which are parallel to the substrate, contact the P-type organic semiconductor layer 200, and face the source electrode 150, form a second protrusion part interposed between the two first protrusion parts.

While FIG. 16 shows two first protrusion parts with one second protrusion part interposed therebetween, the present invention can include more than two first protrusion parts and more than one second protrusion part.

The number of first and second protrusion parts may vary, provided that portions of edges of the source electrode, which are parallel to the substrate, contact the P-type organic semiconductor layer, and face the drain electrode, form at least two first protrusion parts, and portions of edges of the drain electrode, which are parallel to the substrate, contact the P-type organic semiconductor layer, and face the source electrode, form at least one second protrusion part interposed between the first protrusion parts. For example, three first protrusion parts and two second protrusion parts can be formed.

Figure 17:
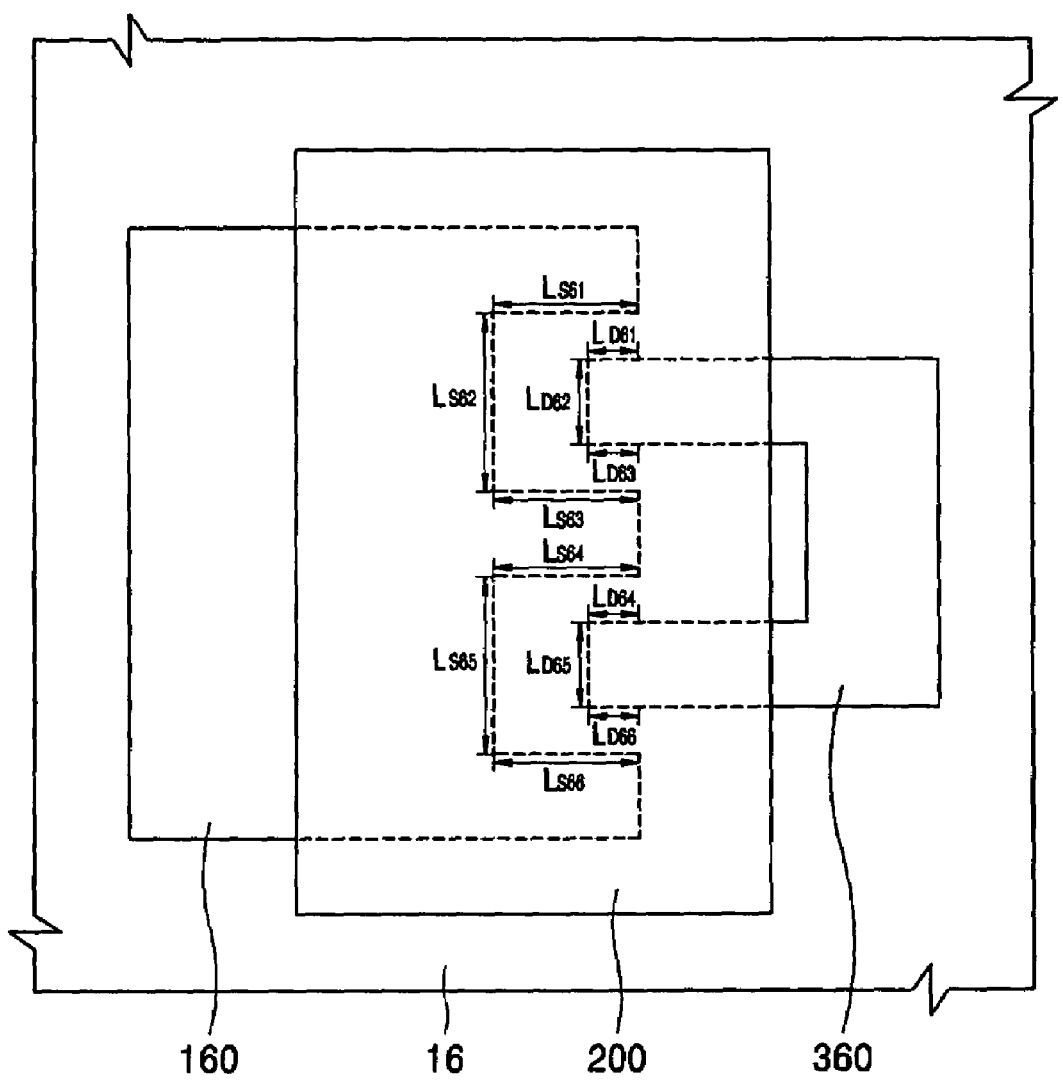
FIG. 17 is a plan view showing an organic TFT according to a sixth exemplary embodiment of the present invention.

FIG. 17 is a plan view showing an organic TFT according to a sixth exemplary embodiment of the present invention.

Referring to FIG. 17, the contact resistance between the source electrode 160 and the P-type organic semiconductor layer 200 can be reduced relatively to the contact resistance between the drain electrode 360 and the P-type organic semiconductor layer 200 by forming the length $L_{S61}+L_{S62}+L_{S63}+L_{S64}+L_{S65}+L_{S66}$ of a portion where the source electrode contacts the organic semiconductor layer greater than the length $L_{D61}+L_{D62}+L_{D63}+L_{D64}+L_{D65}+L_{D66}$ of a portion where the drain electrode contacts the organic semiconductor layer. As FIG. 17 shows, the portions of edges of the source electrode 160, which contact the P-type organic semiconductor layer 200, are parallel to the substrate 10, and face the drain electrode 360, form three first protrusion parts, and the portions of edges of the drain electrode 360, which contact the P-type organic semiconductor layer 200, are parallel to the substrate 10, and face the source electrode 160, form two second protrusion parts interposed between the three first protrusion parts. In this embodiment, the widths of the first protrusion parts are equal to the widths of the second protrusion parts.

As is the case with the fifth embodiment, the number of the first and second protrusion parts may vary with the sixth embodiment.

Figure 18:
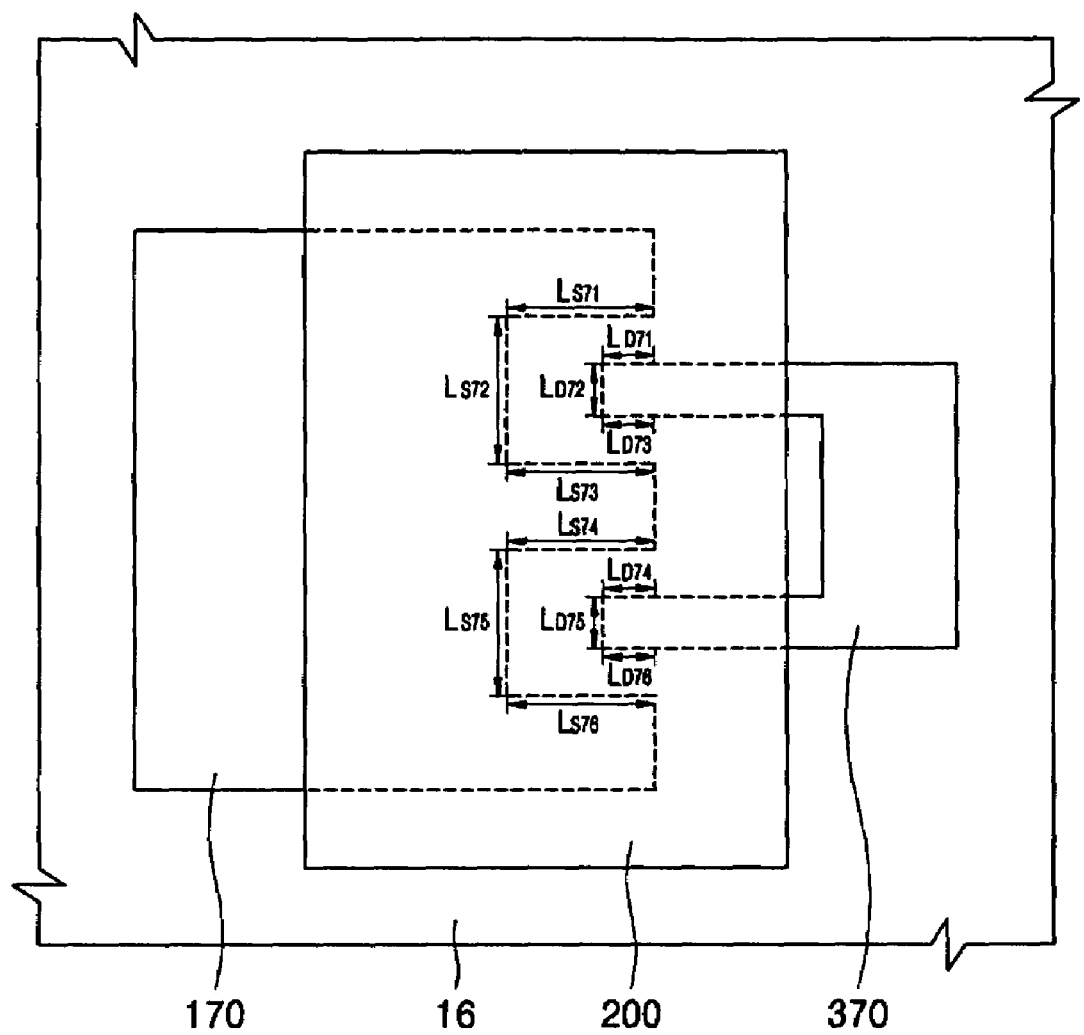
FIG. 18 is a plan view showing an organic TFT according to a seventh exemplary embodiment of the present invention.

FIG. 18 is a plan view showing an organic TFT according to seventh exemplary embodiment of the present invention.

Referring to FIG. 18, the contact resistance between the source electrode 170 and the P-type organic semiconductor layer 200 can be reduced relatively to the contact resistance between the drain electrode 370 and the P-type organic semiconductor layer 200 by forming the length $L_{S71}+L_{S72}+L_{S73}+L_{S74}+L_{S75}+L_{S76}$ of a portion where the source electrode contacts the organic semiconductor layer greater than the length $L_{D71}+L_{D72}+L_{D73}+L_{D74}+L_{D75}+L_{D76}$ of a portion where the drain electrode contacts the organic semiconductor layer. As FIG. 18 shows, the portions of edges of the source electrode 170, which contact the P-type organic semiconductor layer 200, are parallel to the substrate 10, and face the drain electrode 370, form three first protrusion parts, and the portions of edges of the drain electrode 370, which contact the P-type organic semiconductor layer 200, are parallel to the substrate 10, and face the source electrode 170, form two second protrusion parts interposed between the three first protrusion parts.

In this embodiment, the contact resistance between the source electrode 170 and the P-type organic semiconductor layer 200 can further be reduced relatively to the contact resistance between the drain electrode 370 and the P-type organic semiconductor layer 200 by forming the widths of the first protrusion parts greater than the widths of the second protrusion parts. In other words, as compared to FIG. 17, forming narrower second protrusion parts may further reduce the contact resistance between the source electrode and the P-type organic semiconductor layer relatively to the contact resistance between the drain electrode and the P-type organic semiconductor layer.

As is the case with the fifth and sixth embodiments, the number of the first and second protrusion parts may vary with the seventh embodiment.

Figure 19:
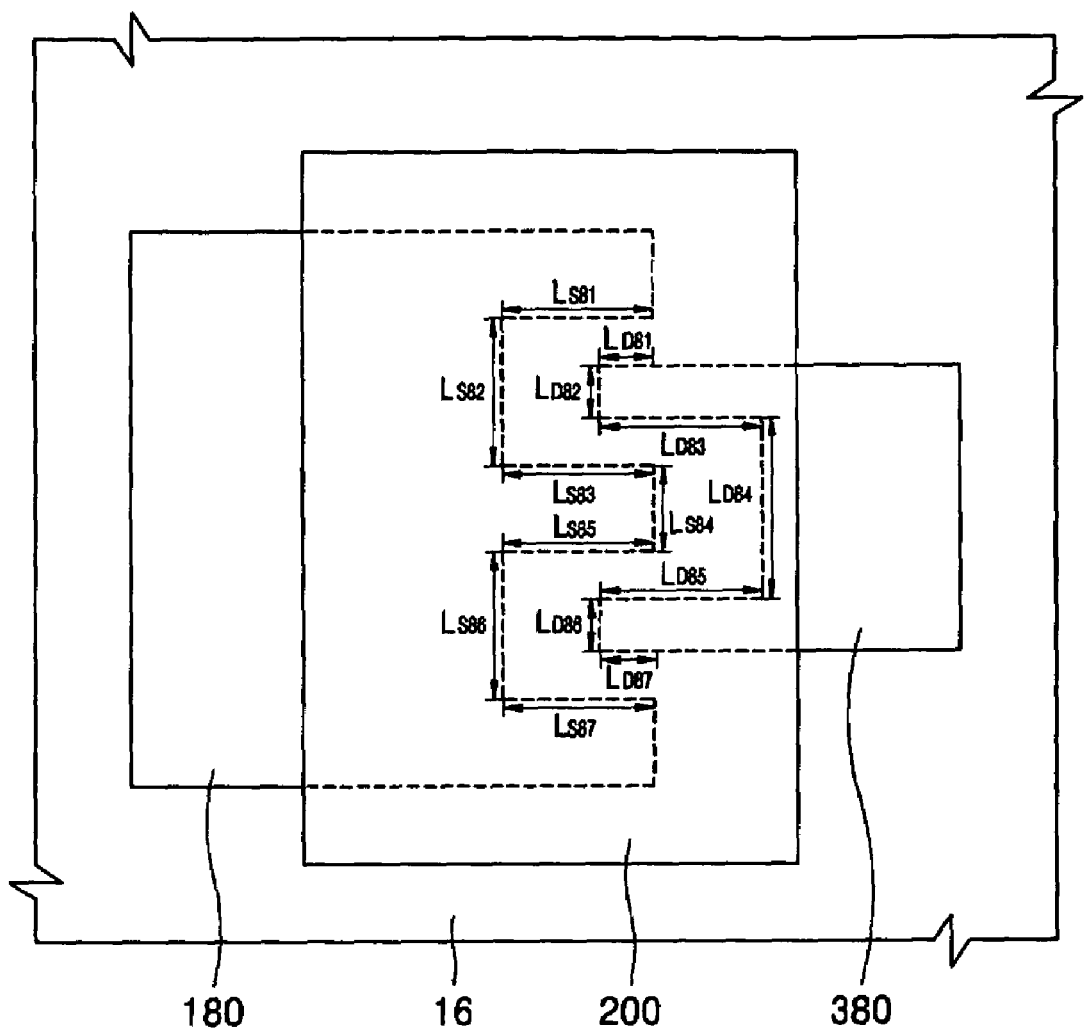
FIG. 19 is a plan view showing an organic TFT according to eighth exemplary embodiment of the present invention.

FIG. 19 is a plan view showing an organic TFT according to an eighth exemplary embodiment of the present invention.

A difference between the seventh embodiment and the present embodiment is that portions of edges of the drain electrode 380, which are parallel to the substrate, face the source electrode 180, and contact the P-type organic semiconductor layer 200, form two parallel lines. That is, the portions of edges of the drain electrode 380, which are parallel to the substrate, face the source electrode 180, and contact the P-type organic semiconductor layer 200, form two parallel lines without disconnections.

Referring to FIG. 19, a portion of the drain electrode 380, indicated as $L_{D84}$, contacts the P-type organic semiconductor layer 200. This denotes that the lengths of contact between the source electrode 180 and a channel region of the P-type organic semiconductor layer 200 and between the drain electrode 380 and a channel region of the P-type organic semiconductor layer 200 increase by $L_{S84}$ and $L_{D84}$, respectively. Also, the contact resistance between the source electrode 180 and the P-type organic semiconductor layer 200 can be reduced relatively to the contact resistance between the drain electrode 380 and the P-type organic semiconductor layer 200 by forming the length $L_{S81}+L_{S82}+L_{S83}+L_{S84}+L_{S85}+L_{S86}+L_{S87}$ of a portion where the source electrode contacts the organic semiconductor layer greater than the length $L_{D81}+L_{D82}+L_{D83}+L_{D84}+L_{D85}+L_{D86}+L_{D87}$ of a portion where the drain electrode contacts the organic semiconductor layer.

As described above, the contact resistance between the source electrode and the P-type organic semiconductor layer may not be controlled once the organic TFT is manufactured because the source electrode is grounded and the work function of a metal forming the source electrode and the HOMO level of the P-type organic semiconductor layer determine the contact resistance. Therefore, it is important to reduce the contact resistance between the source electrode and the P-type organic semiconductor layer relative to the contact resistance between the drain electrode and the P-type organic semiconductor layer.

Therefore, a portion of the source electrode that contacts the P-type organic semiconductor layer, is parallel to the substrate, and faces the drain electrode can be longer than a portion of the drain electrode that contacts the P-type organic semiconductor layer, is parallel to the substrate, and faces the source electrode. Additionally, the contact resistance between the P-type organic semiconductor layer and the source electrode can further be reduced by forming the source and drain electrodes with different material.

The contact resistance between the source electrode and the P-type organic semiconductor layer can be reduced relatively to the contact resistance between the drain electrode and the P-type organic semiconductor layer by forming the source electrode using a material having a greater work function than a work function of a material for forming the drain electrode.

For example, the source electrode may be formed using a metal having a work function greater than 0.5 eV, such as Au, Pt, Pd, or Ni, when the drain electrode is formed of a metal such as MoW, Al, or Indium Tin Oxide (ITO), which have a work function of less than 0.5 eV.

The organic TFT according to the present invention may have a stacked structure including a substrate, a buffer layer, a gate electrode, a gate insulating film, a source electrode, a drain electrode, and a P-type organic semiconductor layer, but it is not limited thereto. For example, in the present embodiments, the P-type organic semiconductor layer is disposed on the source electrode and the drain electrode, but the present invention can be applied to any type, such as co-planar, inverse co-planar, staggered, and inverse staggered types.

As described above, TFTs can be used as switching devices that control the operation of each pixel and driving devices for driving each pixel in a flat panel display such as an LCD or ELD. Therefore, the organic TFT according to the present invention may be used as a switching device, a driving device for driving a pixel or other elements, or it may be used in any application suitable for a TFT. When used as a driving TFT, a first electrode of the pixel can be coupled with either the source electrode or the drain electrode.

The organic TFT according to the present invention is particularly useful for an Organic Electro Luminescence Display (OELD). Therefore, the structure of the OELD will now be described.

The OELD may include a variety of pixel patterns, such as red, green, and blue pixels, according to the color emitted from a light emission layer. Each red, green, and blue sub-pixel includes an organic electroluminescence device and at least one TFT coupled to the organic electroluminescence device. The TFT can be a TFT according to the exemplary embodiments of the present invention. A capacitor can also be included in a sub-pixel.

The organic electroluminescence device may be current-driven, and it displays a predetermined image by emitting red, green, or blue lights according to the current flow between the device's two electrodes. The two electrodes include a first electrode coupled to either the source electrode or the drain electrode of the organic TFT, and a second electrode formed to cover all pixels or to correspond to each pixel. The organic electroluminescence device further includes an intermediate layer formed of an organic layer, having at least a light emitting layer, interposed between the first and second electrodes. The present invention is not limited to this structure.

The first electrode may function as an anode, and the second electrode may function as a cathode. Of course, the polarity of the first and second electrodes can be reversed.

The first electrode can be used as a transparent electrode or a reflection electrode. When used as a transparent electrode, it can be formed of ITO, IZO, ZnO or $In_2O_3$, and when used as a reflection electrode, it can be formed of ITO, IZO, ZnO or $In_2O_3$ on a reflection film after forming the reflection film using Ag, Mg, Al, Pt, Pd, Au, Ni, Nd, Ir, Cr, or a compound of these metals.

The second electrode can also be used as a transparent electrode or a reflection electrode. When used as a transparent electrode, it can include an auxiliary electrode layer or a bus electrode line formed of a material for forming the transparent electrode, such as ITO, IZO, ZnO, or $InO_3$, on an intermediate layer formed using a material such as Li, Ca, LiF/Ca, LiF/Al, Al, Ag, Mg, or a compound of these materials. On the other hand, when used as a reflection electrode, it is formed by entirely depositing Li, Ca, LiF/Ca, LiF/Al, Al, Ag, Mg, or a compound of these metals. However, the present invention is not limited thereto, and an organic material, such as a conductive polymer, can be used as the first and second electrodes.

The intermediate layer formed of an organic film can include a low molecular weight organic film or a polymer organic film.

If formed of a low molecular weight organic film, the intermediate layer can be formed in a single or a composite structure by stacking a Hole Injection Layer (HIL), a Hole Transport Layer (HTL), an Emission Layer (EML), an Electron Transport Layer (ETL), and an Electron Injection Layer (EIL). An organic material that can be used for forming the intermediate layer includes copper phthalocyanine (CuPc), N,N'-Di(naphthalene-1-yl)-N,N'-diphenyl-benzidine (NPB), and tris-8-hydroxyquinoline aluminum (Alq3). The low molecular weight organic film can be formed by an evaporation method. The structure of the intermediate layer is not limited thereto.

If the intermediate layer is formed of a polymer organic film, it can include a HTL and an EML. The polymer HTL can be formed by poly-(2,4)-ethylene-dihydroxy thiophene (PEDOT) or polyaniline (PANI) using an inkjet printing or a spin coating method. The polymer organic light emitting layer can be formed of Poly-Phenylenevinylene (PPV), Soluble PPV's, Cyano-PPV, or Polyfluorene, and a color pattern may be formed using conventional methods, such as an ink jet printing, a spin coating, or a thermal transcribing method using a laser. The structure of the intermediate layer of the polymer organic layer is not limited thereto.

In the OELD having the above structure, the light emission of each pixel can be controlled by at least one organic TFT, which is coupled to the first electrode of the organic electroluminescence device to control the current flow into the first electrode. In this case, a flexible OELD can be formed by using a flexible plastic substrate.

The structure of an LCD panel will now be described in brief since the organic TFT can also be applied to the LCD panel.

A cultivating layer that faces a liquid crystal layer is interposed between facing first and second substrates, a first electrode is interposed between the cultivating layer and the first substrate, and a second electrode is interposed between the cultivating layer and the second substrate. A color filter layer is interposed between the second substrate and the second electrode.

A first polarizing layer is disposed on the first substrate's surface facing away from the second substrate, and a second polarizing layer is disposed on the second substrate's surface facing away from the first substrate. A protection film is disposed on the second polarizing layer.

In such an LCD panel, a potential difference between the first electrode and the second electrode is generated by an external signal controlled by the organic TFT since the first electrode is coupled to the organic TFT, as described above. The potential difference between the first and second electrodes determines the arrangement of the liquid crystal layer, which determines whether visible light, which is supplied from a back light unit (BLU) included on a lower part of the first substrate of the liquid crystal panel, is shielded or transmitted. The transmitted light becomes a predetermined color while passing through the color filter layer, thereby displaying a color image.

The organic TFT according to the present invention can be included in each sub-pixel, and it can be used in a driving circuit that does not display an image. Also, the organic TFT can be applied to any equipment that includes a TFT, such as electronic sheets, smart cards, product tags, or plastic chips for radio frequency identification (RFID) (e.g. smart tags).

The organic TFT according to the present invention and a flat panel display device having the organic TFT may have the following advantages.

First, reducing the contact resistance between the source electrode and the P-type organic semiconductor layer may improve the organic TFT's characteristics.

Second, reducing the contact resistance between the source electrode and the P-type organic semiconductor layer may reduce power consumption.

Third, the organic TFT can be manufactured using a low temperature process, which permits fabrication of a flat panel display on a flexible substrate made of plastic material.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic thin film transistor (TFT), comprising:
   a substrate;
   a gate electrode disposed on the substrate;
   a source electrode and a drain electrode insulated from the gate electrode and disposed on the substrate; and
   an organic semiconductor layer that contacts the source electrode and the drain electrode, is insulated from the gate electrode, and is disposed on the substrate,
   wherein a sum of lengths of portions of edges of the source electrode, which are parallel to the substrate, contact the organic semiconductor layer, and face the drain electrode, is greater than a sum of lengths of portions of edges of the drain electrode, which are parallel to the substrate, contact the organic semiconductor layer, and face the source electrode, and
   wherein a work function of the source electrode is greater than a work function of the drain electrode.

2. The organic TFT of claim 1, wherein each of the portions of edges of the source electrode and the portions of edges of the drain electrode form a straight line.

3. The organic TFT of claim 1, wherein the portions of edges of the source electrode have a structure that surrounds the portions of edges of the drain electrode.

4. The organic TFT of claim 3, wherein a width of an end portion of the source electrode, which contacts the organic semiconductor layer and faces the drain electrode, is equal to a width of an end portion of the drain electrode, which contacts the organic semiconductor layer and faces the source electrode.

5. The organic TFT of claim 3, wherein a width of an end portion of the source electrode, which contacts the organic semiconductor layer and faces the drain electrode, is greater than a width of an end portion of the drain electrode, which contacts the organic semiconductor layer and faces the source electrode.

6. The organic TFT of claim 5, wherein each edge of the portions of edges of the source electrode is parallel to a corresponding edge of the portions of edges of the drain electrode.

7. The organic TFT of claim 3, wherein the drain electrode comprises two portions of edges that are parallel to the substrate, contact the organic semiconductor layer, and face the source electrode.

8. The organic TFT of claim 1,
   wherein the portions of edges of the source electrode form at least two first protrusion parts and the portions of edges of the drain electrode form at least one second protrusion part, and
   wherein each second protrusion part is interposed between first protrusion parts.

9. The organic TFT of claim 8, wherein widths of the first protrusion parts are equal to widths of the second protrusion parts.

10. The organic TFT of claim 8, wherein widths of the first protrusion parts are greater than widths of the second protrusion parts.

11. The organic TFT of claim 8, wherein portions of edges of the drain electrode, which are parallel to the substrate and contact the organic semiconductor layer, form two parallel line segments.

12. The organic TFT of claim 8, wherein portions of edges of the drain electrode, which contact the organic semiconductor layer, are only the second protrusion parts of the drain electrode.

13. The organic TFT of claim 1, wherein the source electrode and the drain electrode are formed of different materials from each other.

14. The organic TFT of claim 13, wherein the source electrode is formed of one of Au, Pt, Pd, and Ni, and the drain electrode is formed of one of MoW, Al, and ITO.

15. The organic TFT of claim 1, wherein the organic semiconductor layer is formed of a material selected from the group consisting of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyflorene and its derivatives, polythiophenevinylene and its derivatives, polythiophene-heterocyclic aromatic copolymer and its derivatives, oligoacene of naphthalene and its derivatives, alpha-5-thiophene oligothiophene and its derivatives, phthalocyanine that does not include a metal and its derivatives, pyromelitic dianhydride and its derivatives, pyromelitic diimide and its derivatives, perylenetetracarboxylic acid dianhydride and its derivatives, and perylenetetracarboxylic diimide and its derivatives.

16. A flat panel display comprising the organic TFT of claim 1.

17. The flat panel display of claim 16, wherein the flat panel display is an electroluminescence display.

\* \* \* \* \*